United States Patent
Hayashi et al.

(10) Patent No.: US 10,123,415 B2
(45) Date of Patent: Nov. 6, 2018

(54) WIRING SUBSTRATE AND PRODUCTION METHOD THEREFOR

(71) Applicant: NGK SPARK PLUG CO., LTD., Nagoya-shi, Aichi (JP)

(72) Inventors: Takahiro Hayashi, Komaki (JP); Seiji Mori, Konan (JP); Tatsuya Ito, Kakamigahara (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 255 days.

(21) Appl. No.: 14/416,254

(22) PCT Filed: Jul. 29, 2013

(86) PCT No.: PCT/JP2013/004588
§ 371 (c)(1),
(2) Date: Jan. 21, 2015

(87) PCT Pub. No.: WO2014/038125
PCT Pub. Date: Mar. 13, 2014

(65) Prior Publication Data
US 2015/0189752 A1 Jul. 2, 2015

(30) Foreign Application Priority Data

Sep. 7, 2012 (JP) ................................. 2012-196863

(51) Int. Cl.
*H05K 1/11* (2006.01)
*H05K 3/40* (2006.01)
(Continued)

(52) U.S. Cl.
CPC .......... *H05K 1/119* (2013.01); *H05K 1/0326* (2013.01); *H05K 1/0346* (2013.01); *H05K 1/09* (2013.01);
(Continued)

(58) Field of Classification Search
CPC ...... H05K 1/0326; H05K 1/09; H05K 3/3452; H05K 3/3473; H05K 3/4007; H05K 2201/0367
(Continued)

(56) References Cited

U.S. PATENT DOCUMENTS 7,569,935 B1 *  8/2009  Fan ......................... H01L 24/16
                                                    257/737
2002/0149118 A1 * 10/2002 Yamaguchi ............. H01L 24/11
                                                    257/778

(Continued)

FOREIGN PATENT DOCUMENTS

JP    2001-267376 A    9/2001
JP    2002-289652 A   10/2002
(Continued)

OTHER PUBLICATIONS

JPO/ISA, International Search Report in corresponding international application No. PCT/JP2013/004588, dated Oct. 8, 2013.
(Continued)

*Primary Examiner* — Timothy Thompson
*Assistant Examiner* — Rhadames J Alonzo Miller
(74) *Attorney, Agent, or Firm* — Stites & Harbison, PLLC; Jeffrey A. Haeberlin; James R. Hayne

(57) ABSTRACT

A wiring substrate includes a surface layer having electrical insulation properties and a connection terminal having electrical conduction properties and protruding from the surface layer. The connection terminal includes a base portion, a covering portion and a filling portion. The base portion of the connection terminal is made of an electrically conductive first metal and located adjacent to the surface layer so as to extend through the surface layer and protrude from the surface layer. The covering portion of the connection terminal is made of an electrically conductive second metal (Continued)

having a melting point lower than that of the first metal and located so as to cover the base portion. The filling portion of the connection terminal is made of at least one of the second metal and an alloy containing the first and second metals and located so as to fill a hollow in the base portion.

3 Claims, 8 Drawing Sheets

(51) Int. Cl.
    *H05K 1/03*     (2006.01)
    *H05K 1/09*     (2006.01)
    *H05K 3/20*     (2006.01)
    *H05K 3/34*     (2006.01)

(52) U.S. Cl.
    CPC ............. *H05K 3/20* (2013.01); *H05K 3/3473* (2013.01); *H05K 3/4007* (2013.01); *H05K 3/3452* (2013.01); *H05K 2201/0367* (2013.01); *H05K 2201/10674* (2013.01); *H05K 2203/04* (2013.01)

(58) Field of Classification Search
    USPC .................. 174/257; 228/101; 257/737, 751
    See application file for complete search history.

(56) References Cited

U.S. PATENT DOCUMENTS

| | | | | |
|---|---|---|---|---|
| 2005/0056445 A1* | 3/2005 | Orui | ..................... | H05K 3/3452 174/535 |
| 2005/0167830 A1* | 8/2005 | Chang | ............... | H01L 23/49816 257/737 |
| 2005/0269206 A1* | 12/2005 | Tanaka | ................... | H05K 3/108 205/125 |
| 2006/0163725 A1* | 7/2006 | Haba | ................... | H01L 21/4846 257/737 |
| 2006/0252248 A1* | 11/2006 | Hu | ......................... | H05K 3/243 438/613 |
| 2006/0279000 A1 | 12/2006 | Chang et al. | | |
| 2008/0264681 A1* | 10/2008 | Iwai | ..................... | H01L 21/4853 174/257 |
| 2009/0045523 A1* | 2/2009 | Fan | ........................ | H01L 25/105 257/777 |
| 2009/0071710 A1* | 3/2009 | Stelzl | .................. | H01L 23/3164 174/520 |
| 2010/0291385 A1* | 11/2010 | Greer | .................. | B81C 1/00031 428/398 |
| 2011/0079916 A1* | 4/2011 | West | ..................... | H01L 23/481 257/774 |
| 2011/0084370 A1* | 4/2011 | Su | ........................ | H01L 21/6835 257/669 |
| 2012/0252168 A1* | 10/2012 | Nah | ....................... | H01L 21/563 438/124 |
| 2013/0168144 A1* | 7/2013 | Jeong | .................. | H05K 3/4007 174/257 |

FOREIGN PATENT DOCUMENTS

| | | |
|---|---|---|
| JP | 2007-103648 A | 4/2007 |
| JP | 2010-153744 A | 7/2010 |
| JP | 2011-192692 A | 9/2011 |
| TW | 200525650 A | 8/2005 |

OTHER PUBLICATIONS

State Intellectual Property Office, Notification of the Second Office Action (English translation not available) issued in corresponding Application No. 201380046617.0, dated May 17, 2017.

* cited by examiner

WIRING SUBSTRATE AND PRODUCTION METHOD THEREFOR

FIELD OF THE INVENTION

The present invention relates to a wiring substrate and a production method therefor.

BACKGROUND ART

A wiring substrate is known, which is of the type adapted to mount thereon a semiconductor chip (see, for example, Patent Documents 1 and 2). In this type of wiring substrate, connection terminals are provided for connection to the semiconductor chip.

Patent Document 1 discloses to form an insulating layer with an opening through which a plurality of connection terminals are exposed, provide an insulating substance between the connection terminals within the opening, and then, perform plating on the connection terminals for the purpose of preventing an electrical short circuit caused between the connection terminals by plating material. Patent Document 2 discloses to, for the purpose of preventing an electrical short circuit caused between connection terminals by soldering, form an insulating layer between the connection terminals and make the thickness of the insulating layer smaller than that of the connection terminals.

PRIOR ART DOCUMENTS

Patent Documents

Patent Document 1: Japanese Laid-Open Patent Publication No. 2007-103648
Patent Document 2: Japanese Laid-Open Patent Publication No. 2011-192692

SUMMARY OF THE INVENTION

Problems to be Solved by the Invention

In the techniques of Patent Documents 1 and 2, sufficient consideration has not been given to the occurrence of damage of the connection terminals during production of the wiring substrate. The techniques of Patent Documents 1 and 2 thus have the possibility of damage of the connection terminals during production of the wiring substrate so that the mechanical and electrical characteristics of the connection terminals are deteriorated. This leads to degradation in the reliability of connection of the connection terminals to the semiconductor chip. It is assumed that the connection terminals would sustain such damage due to not only contact with another object e.g. production equipment or another wiring substrate but also excessive erosion by various treatments e.g. etching, washing and plating. In the case of performing displacement plating on the connection terminals, for example, the connection terminals may be excessively eroded by a plating treatment solution and thereby hollowed out during the displacement plating.

Means for Solving the Problems

The present invention has been made to solve at least part of the above problems and can be embodied in the following aspects.

(1) According to one aspect of the present invention, there is provided a wiring substrate, comprising: a surface layer having electrical insulation properties; and a connection terminal having electrical conduction properties and protruding from the surface layer, wherein the connection terminal includes: a base portion made of an electrically conductive first metal and located adjacent to the surface layer so as to extend through the surface layer and protrude from the surface layer; a covering portion made of an electrically conductive second metal having a melting point lower than that of the first metal and covering the base portion; and a filling portion made of at least one of the second metal and an alloy containing the first and second metals and filling a hollow in the base portion.

It is possible in such a wiring substrate to, even when the mechanical and electrical characteristics of the base portion are deteriorated due to the hollow, allow the filling portion to recover the deteriorated mechanical and electrical characteristics of the base portion and improve the reliability of connection of the connection terminal.

(2) In the above wiring substrate, copper (Cu) and tin (Sn) may be used as the first metal and the second metal, respectively. In this case, it is possible to allow improvement in the reliability of connection of the connection terminal with the copper base portion and the tin covering portion.

(3) According to another aspect of the present invention, there is provided a production method of a wiring substrate, the wiring substrate comprising: a surface layer having electrical insulation properties; and a connection terminal protruding from the surface layer and including a base portion made of an electrically conductive first metal and a covering portion made of an electrically conductive second metal having a melting point lower than that of the first metal and covering the base portion, the production method comprising: heating the connection terminal at a temperature higher than or equal to the melting point of the second metal so as to fill a hollow region in the base portion with a molten metal melted from at least the covering portion among the base portion and the covering portion.

It is possible in such a wiring substrate production method to, even when the mechanical and electrical characteristics of the base portion are deteriorated due to the hollow, allow the filling portion to recover the deteriorated mechanical and electrical characteristics of the base portion and improve the reliability of connection of the connection terminal.

(4) In the above wiring substrate production method, the hollow may be provided in the base portion during the formation of the covering portion by displacement plating.

In this case, it is possible to recover the base portion deteriorated by displacement plating.

(5) According to still another aspect of the present invention, there is provided a wiring substrate, comprising: a surface layer having electrical insulation properties; and a connection terminal having electrical conduction properties and protruding from the surface layer, wherein the connection terminal includes: a base portion made of an electrically conductive first metal and located adjacent to the surface layer; a covering portion made of an electrically conductive second metal having a melting point lower than that of the first metal and covering the base portion; and a filling portion made of at least one of the second metal and an alloy containing the first and second metals and filling a hollow in the base portion.

It is possible in such a wiring substrate to, even when the mechanical and electrical characteristics of the base portion are deteriorated due to the hollow, allow the filling portion to recover the deteriorated mechanical and electrical characteristics of the base portion and improve the reliability of connection of the connection terminal. In this wiring substrate, copper (Cu) and tin (Sn) may be used as the first metal and the second metal, respectively.

The present invention can be embodied in various forms other than the wiring substrate, e.g., in the form of a device equipped with the wiring substrate, an apparatus for production of the wiring substrate and the like.

DESCRIPTION OF THE EMBODIMENTS

A. Embodiment

Figure 1:
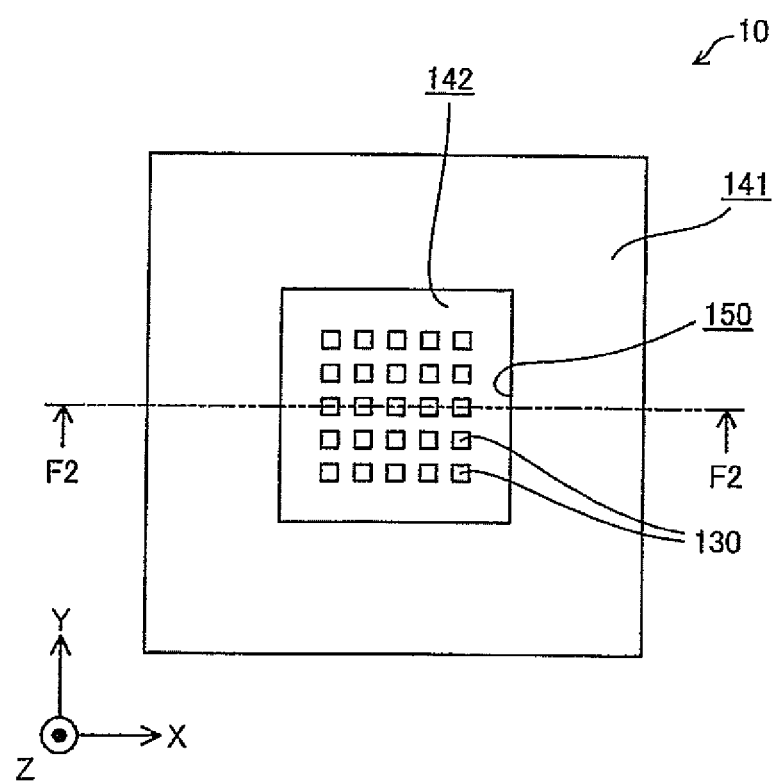
FIG. 1 is a top view of a wiring substrate according to one embodiment of the present invention.
Figure 2:
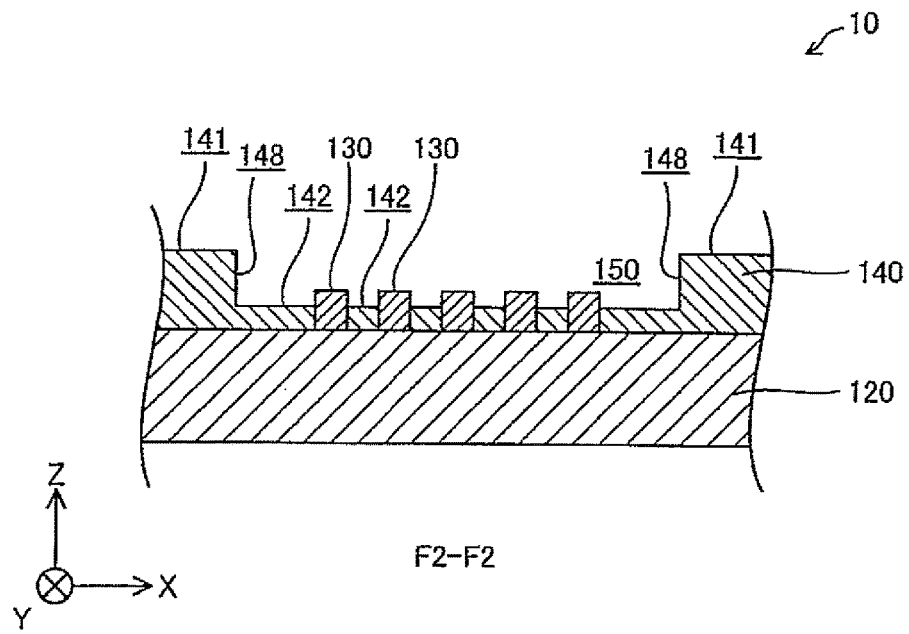
FIG. 2 is a schematic section view of part of the wiring substrate according to the one embodiment of the present invention.
Figure 3:
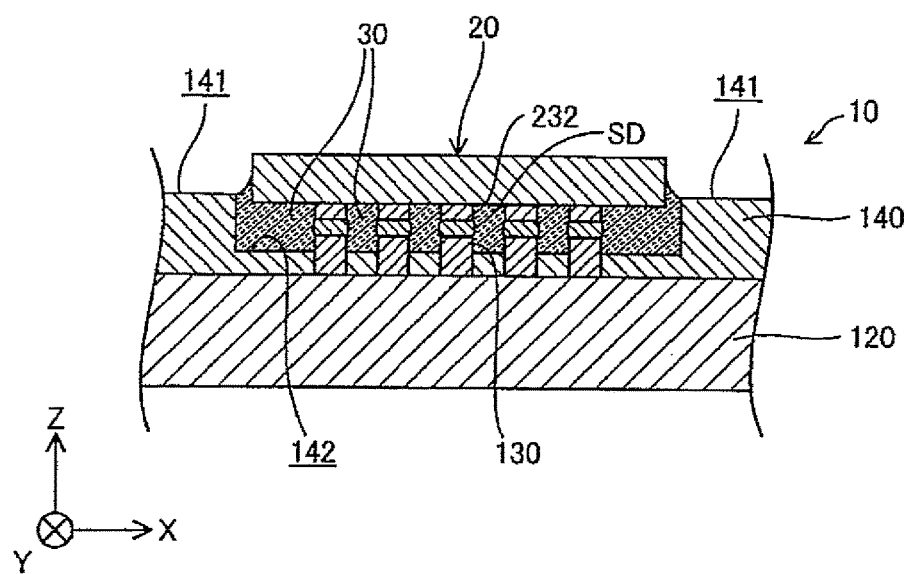
FIG. 3 is a schematic section view of part of the wiring substrate, in a condition that a semiconductor chip is mounted on the wiring substrate, according to the one embodiment of the present invention.

FIG. 1 is a top view of a wiring substrate 10 according to one embodiment of the present invention. FIG. 2 is a schematic section view of part of the wiring substrate 10. FIG. 3 is a schematic section view of part of the wiring substrate 10 in a condition that a semiconductor chip 20 is mounted on the wiring substrate 10. It is herein noted that: FIG. 2 shows a cross section of the wiring substrate 10 as taken along line F2-F2 of FIG. 1; and FIG. 3 shows a cross section of the wiring substrate 10, on which the semiconductor chip 20 is mounted, as taken at a position corresponding to line F2-F2 of FIG. 1.

The wiring substrate 10 is in the form of a plate-shaped substrate produced using an organic material and thereby also called "organic substrate". In the present embodiment, the wiring substrate 10 is adapted for flip-chip mounting to mount thereon the semiconductor chip 20 as shown in FIG. 3.

As shown in FIGS. 2 and 3, the wiring substrate 10 includes a substrate layer 120, connection terminals 130 and a surface layer 140. In the wiring substrate 10 of the present embodiment, the connection terminals 130 and the surface layer 140 are formed on the substrate layer 120 in such a manner that the connection terminals 130 are exposed from the surface layer 140. In another alternative embodiment, the wiring substrate 10 may have a multilayer structure in which a plurality of conductor layers and a plurality of insulating layers are alternately laminated on the substrate layer 120. It is feasible to form such a multilayer structure may on each of both sides of the substrate layer 120.

In FIG. 1, there are illustrated X, Y and Z axes perpendicular to one another. It is noted that the X, Y and Z axes of FIG. 1 correspond to those of the other figures. The Z axis refers to one of these axes extending in a lamination direction of the surface layer 140 relative to the substrate layer 120 where +Z axis direction is defined as a direction from the substrate layer 120 to the surface layer 140 along the Z axis; and −Z axis direction is defined as a direction opposite the +Z axis direction. The X and Y axes refer to the other two of these axes extending in a layer in-plane direction perpendicular to the Z axis where +X axis direction is defined as a direction from the left side to the right side along the X axis in FIG. 1; −X axis direction is defined as a direction opposite the +X axis direction; +Y axis direction is defined as a direction from the back side to the front side along the Y axis in FIG. 1; and −Y axis direction is defined as a direction opposite the +Y axis direction.

The substrate layer 120 of the wiring substrate 10 is made of an insulating material in a plate shape. In the present embodiment, a thermosetting resin such as bismaleimide-triazine resin (BT) or epoxy resin is used as the insulating material of the substrate layer 120. The insulating material of the substrate layer 120 may be a fiber reinforced resin (such as glass-fiber reinforced epoxy resin). Although not shown in FIGS. 1 to 3, through holes and through-hole conductors may be formed in the substrate layer 120 as a part of wiring for connection to the connection terminals 130.

The surface layer 140 of the wiring substrate 10 is made as a layer of an insulating material called "solder resist". The surface layer 140 has a first surface region 141, a second surface region 142 and a wall surface region 148.

The first surface region 141 is a surface region of the surface layer 140 in which an opening 150 is formed. In the present embodiment, the first surface region 141 is oriented along the X and Y axes and directed toward the +Z axis direction so as to constitute a part of a +Z axis side surface of the surface layer 140.

The second surface region 142 is a surface region of the surface layer 140 located inside the opening 150 and recessed toward the substrate layer 120 relative to the first surface region 141. In the present embodiment, the second surface region 142 is oriented along the X and Y axes and directed toward the +Z axis direction so as to constitute a part of the +Z axis side surface of the surface layer 140 inside the opening 150. As shown in FIGS. 1 and 2, the connection terminals 130 are exposed from the second surface region 142.

The wall surface region 148 is a surface region of the surface layer 140 extending between the first and second surface regions 141 and 142 in the lamination direction (Z axis direction) and thereby defining the opening 150. In the present embodiment, the wall surface region 148 is connected to each of the first and second surface regions 141 and 142 so as to form a square corner therebetween as shown in FIG. 2. In another alternative embodiment, the wall surface region 148 may be connected to at least one of the first and second surface regions 141 and 142 via a curved corner surface.

The connection terminals 130 of the wiring substrate 10 are provided as a conductor pattern of a conductive material on the substrate layer 120. In the present embodiment, the connection terminals 130 are formed by applying a copper plating layer to a surface of the substrate layer 120 and etching the copper plating layer into a desired shape.

The connection terminals 130 are exposed from the surface layer 140 and, more specifically, the second surface region 142 of the surface layer 140. In the present embodiment, the connection terminals 130 protrude from the second surface region 142 in the +Z axis direction as shown in FIG. 2.

As shown in FIG. 3, the connection terminals 130 are used so as to make connection to connection terminals 232 of the semiconductor chip 20 via soldering SD. At the time of mounting the semiconductor chip 20 to the wiring substrate 10, the connection terminals 130 are soldered to the respective connection terminals 232 of the semiconductor chip 20; and an underfill material 30 is charged into a clearance within the opening 150 between the wiring substrate 10 and the semiconductor chip 20.

In the present embodiment, a plurality of the connection terminals 130 are provided on the wiring substrate 10. These plural connection terminals 130 are arranged in an array along the X and Y axes as shown in FIG. 1. Although the plural connection terminals 130 are arrayed in 5 columns and 5 rows in the present embodiment, the arrangement of the connection terminals 130 is not limited to such an array. It is feasible to arrange the plural connection terminals 130 in any array of n columns and m rows (where n and m each represents a natural number of 1 or greater except the case of n=m=1). Alternatively, the plural connection terminals 130 may be arranged in a staggered manner by alternately displacing adjacent ones of the connection terminals 130.

Figure 4:
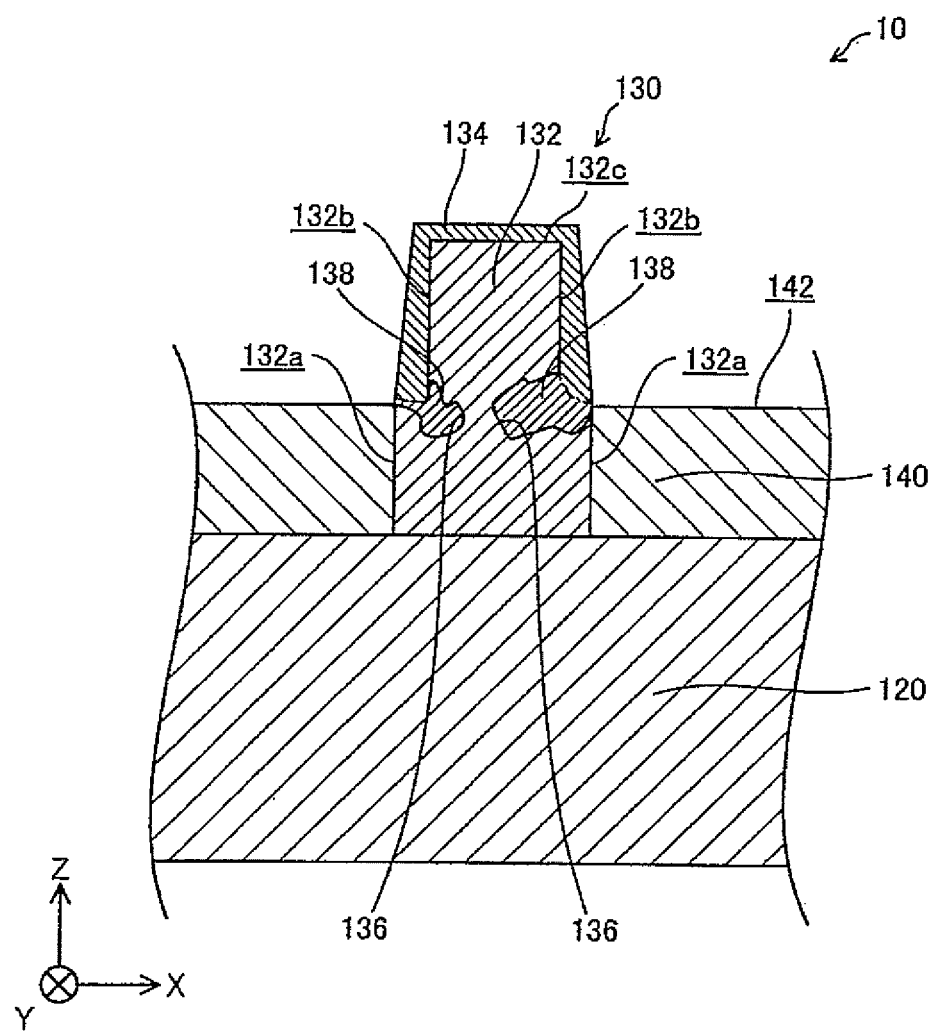
FIG. 4 is an enlarged section view of part of the wiring substrate, schematically showing the detailed configuration of a connection terminal in the wiring substrate, according to the one embodiment of the present invention.

FIG. 4 is an enlarged section view schematically showing the detailed configuration of the connection terminal 130 in the wiring substrate 10. It is noted that FIG. 4 shows, by enlargement, one of the connection terminals 130 of FIG. 2. The connection terminal 130 has a base portion 132, a covering portion 134 and a filling portion 138.

The base portion 132 of the connection terminal 130 is located adjacent to the surface layer 140 so as to extend through the surface layer 140 and protrude from the surface layer 140. More specifically, the base portion 132 is located adjacent to the surface layer 140 so as to extend through the surface layer 140 from the substrate layer 120 toward the +Z axis direction and protrude from the second surface region 142 of the surface layer 140 toward the +Z axis direction in the present embodiment. The base portion 132 is made of an electrically conductive first metal. In the present embodiment copper (Cu) is used as the first metal of the base portion 132. It is feasible in another alternative embodiment to use another electrically conductive metal material as the first metal.

In the present embodiment, the base portion 132 is provided with a lateral region 132a, a lateral region 132b and an end region 132c. The lateral region 132a of the base portion 132 is situated on the −Z axis side with respect to the second surface region 142 and adjacent to the inside of the surface layer 140. The lateral region 132b of the base portion 132 is situated on the +Z axis side with respect to the second surface region 142 and is connected to the end region 132c. The end region 132c of the base portion 132 is provided so as to constitute a +Z axis side end of the base portion 132. The lateral portion 132b and the end portion 132c are covered by the covering portion 134.

The covering portion 134 of the connection terminal 130 is located so as to cover the base portion 132. In the present embodiment, the covering portion 134 covers the lateral portion 132b and the end portion 132c of the base portion 132 as mentioned above. The covering portion 134 is made of an electrically conductive second metal. The second metal of the covering portion 134 is lower in melting point than the first metal of the base portion 132. In the present embodiment, tin (Sn) is used as the second metal of the covering portion 134. It is feasible in another alternative embodiment to use another electrically conductive metal material as the second metal.

The filling portion 138 of the connection terminal 130 is located so as to fill a hollow 136 in the base portion 132. The hollow 136 is provided from the outside to the inside of the base portion 132 at a position between the lateral regions 132a and 132b. In the present embodiment, the filling portion 138 is mainly made of the second metal of the covering portion 134 but partly made of an alloy containing the first and second metals. It is feasible that the filling portion 138 is made of at least one of the second metal and the alloy containing the first and second metals.

Figure 5:
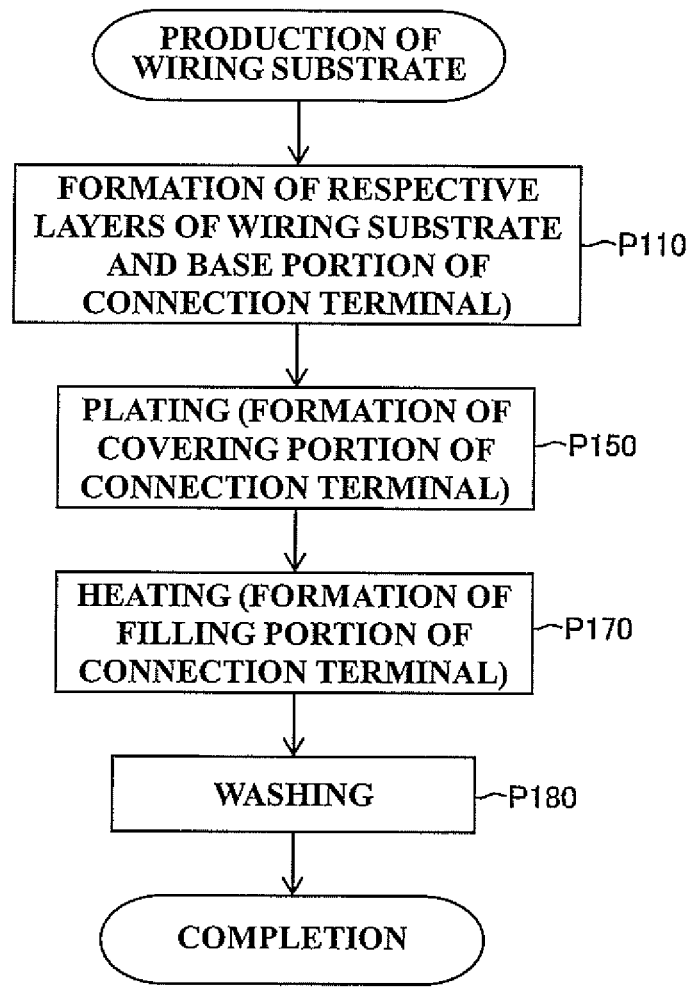
FIG. 5 is a flowchart for production of the wiring substrate according to the one embodiment of the present invention.

FIG. 5 is a flowchart for production of the wiring substrate 10. For the production of the wiring substrate 10, the respective layers of the wiring substrate 10, i.e., the substrate layer 120 and the surface layer 140, and the base portions 132 of the connection terminals 130 are first formed (process step P110). In the present embodiment, the base portions 132 of the connection terminals 130 are formed by applying a copper plating layer to the surface of the substrate layer 120 and etching the copper plating layer into a desired shape.

Further, the surface layer 140 is formed by applying a photocurable insulating resin to the surface of the substrate layer 120 on which the base portions 132 of the connection terminals 130 have been formed, and then, subjecting the applied resin to exposure and development in the present embodiment. The opening 150 of the surface layer 140 corresponds to where masking has been applied during the exposure. The second surface region 142 and the wall surface region 148 are thus defined on the surface layer 140 by washing away uncured resin part during the development. As a result, the first and second surface regions 141 and 142 and the wall surface region 148 are formed integrally so as to constitute the surface layer 140 as a single layer in the present embodiment. It is feasible in another alternative embodiment to define the second surface region 142 on the surface layer 140 by, after making the opening 150 in the surface layer 140 such that the opening 150 reaches the base portion 132, charging the photocurable insulating resin again into the opening 150.

Figure 6:
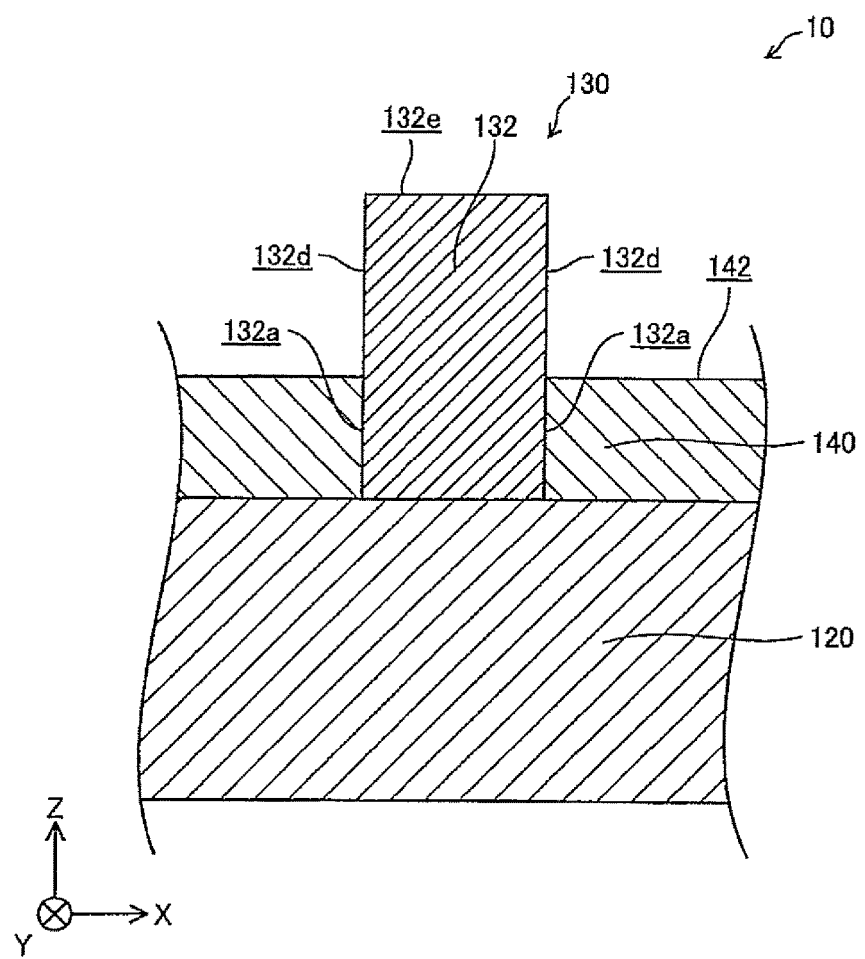
FIG. 6 is an enlarged section view of part of the wiring substrate, schematically showing the detailed configuration of the connection terminal during the process of production of the wiring substrate, according to the one embodiment of the present invention.

FIG. 6 is an enlarged section view showing the detailed configuration of the connection terminal 130 during the process of production of the wiring substrate 10. It is herein noted that FIG. 6 shows the state of the wiring substrate 10 after the completion of the process step P110.

In the state after the process step P110, the base portion 132 of the connection terminal 130 is provided adjacent to the surface layer 140 with a part of the base portion 132 extending through the surface layer 140 and another part of the base portion 132 being exposed and protruding from the surface layer 140. In other words, the base portion 132 of the connection terminal 130 is provided with a lateral region 132a, a lateral region 132d and an end region 132e in the state after the process step P110. The lateral region 132a of the base portion 132 is situated on the −Z axis side with respect to the second surface region 142 and adjacent to the inside of the surface layer 140. The lateral region 132d of the base portion 132 is situated on the +Z axis side with respect to the second surface region 142 and is continuously connected to the lateral region 132a. The end region 132e of the base portion 132 is provided so as to constitute a +Z axis side end of the base portion 132 and is connected to the lateral region 132d. In this state, the lateral portions 132a and 132d are being exposed from the surface layer 140.

After the completion of the process step P110, the covering portion 134 of the connection terminal 130 is formed by plating treatment (process step P150). In the present embodiment, the covering portion 134 is formed by displacement tin plating that is one type of electroless plating. In another alternative embodiment, the covering portion 134 of the connection terminal 130 may be formed by using another electrically conductive material or by any other plating treatment such as electroplating or chemical plating.

Figure 7:
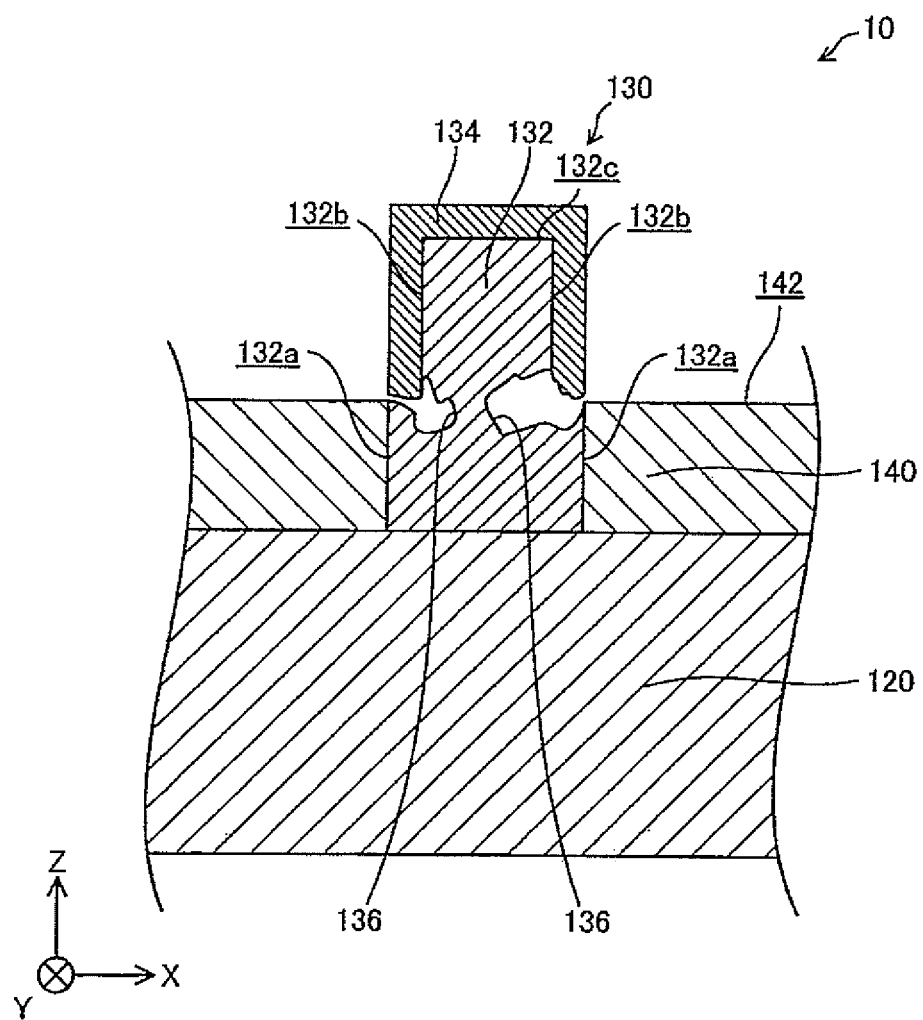
FIG. 7 is an enlarged section view of part of the wiring substrate, schematically showing the detailed configuration of the connection terminal during the process of production of the wiring substrate, according to the one embodiment of the present invention.

FIG. 7 is an enlarged section view showing the detailed configuration of the connection terminal 130 during the process of production of the wiring substrate 10. It is herein noted that FIG. 7 shows the state of the wiring substrate 10 after the completion of the process step P150.

In the process step P150, the displacement plating is performed such that the second metal, i.e., tin (Sn) displaces the first metal, i.e., copper (Cu) on the lateral region 132d and the end region 132e of the base portion 132 of the connection terminal 130. Thus, the base portion 132 is eroded by being formed with a lateral region 132b and an end region 132c in place of the lateral region 132d and the lateral region 132e, respectively, while the covering portion 134 is formed on where the lateral region 132d and the end region 132e have been present as shown in FIG. 7 in the state after the process step P150.

As shown in FIG. 7, the hollow 136 is provided in a part of the base portion 132 between the lateral regions 132a and 132b due to excessive erosion by a plating treatment solution during the displacement tin plating in the process step P150. The hollow 136 of the base portion 132 may be provided due to any causes other than the displacement tin plating, such as contact with another object e.g. production equipment or another wiring substrate, various treatments e.g. etching and washing etc.

After the completion of the process step P150, the filling portion 138 of the connection terminal 130 is formed by heating the wiring substrate 10 (process step P170). In the present embodiment, the filling portion 138 is formed by heating the connection terminal 130 at a temperature higher than the melting point of the second metal, i.e., tin (Sn) and thereby filling the hollow 136 in the base portion 132 with a molten metal melted from at least the covering portion 134 among the base portion 132 and the covering portion 134. By this, the connection terminal 130 is obtained in the form of FIG. 4. It is preferable to avoid melting of the base portion 132, which is made of the first metal, by setting the heating temperature of the connection terminals 130 to be higher than or equal to the melting point of the second metal and lower than the melting point of the first metal. The melting of the base portion 132 may however be allowed within the range that can maintain the function of the connection terminal 130. In another alternative embodiment, the filling portion 138 may be formed simultaneously with the application of soldering SD by reflow treatment for connection of the semiconductor chip 20 and the connection terminal 130.

After the completion of the process step P170, the wiring substrate 10 is washed (process step P180). In this way, the wiring substrate 10 is completed.

It is possible according to the above-mentioned present embodiment to, even when the mechanical and electrical characteristics of the base portion 132 are deteriorated due to the occurrence of the hollow 136, allow the filling portion 138 to recover the deteriorated mechanical and electrical characteristics of the base portion 132 and thereby improve the reliability of connection of the connection terminal 130.

B. Modification Example

Figure 8:
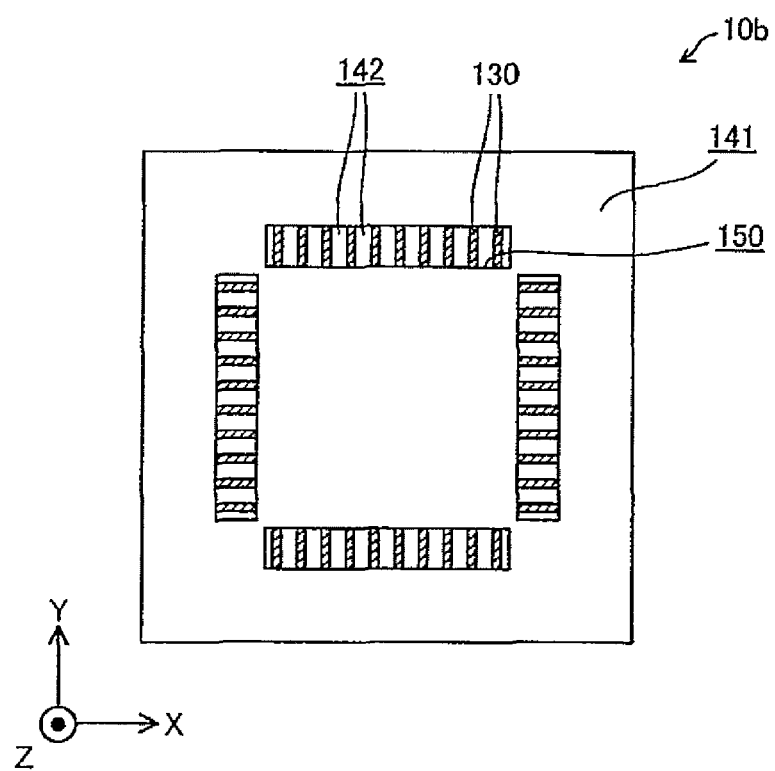
FIG. 8 is a top view of a wiring substrate according to one modification example of the embodiment of the present invention.

FIG. 8 is a top view of a wiring substrate 10b according to one modification example of the above embodiment. Herein, the same constituent parts of the wiring substrate 10b as those of the wiring substrate 10 of the above embodiment are denoted by the same reference numerals to avoid duplicating explanation thereof It is noted that the present modification example is applicable to the other embodiments and other modification examples explained in the present specification. The wiring substrate 10b of the present modification example is the same as the wiring substrate 10 of the above embodiment, except for the shapes of first and second surface regions 141 and 142, connection terminals 130 and openings 150.

Four openings 150 are formed in the first surface region 141 of the wiring substrate 10b. These four openings 150 are rectangular in shape when viewed from the +Z axis direction and are arranged so as to surround and define a rectangle area in the center of the first surface region 141 of the wiring substrate 10b. In the present embodiments, the four openings 150 are arranged along outer peripheral edges of the wiring substrate 10b, respectively.

In FIG. 8, the connection terminals 130 are indicated by hatching. In the present modification example, a plurality of second surface regions 142 and a plurality of connection terminals 130 are provided in the opening 150. Each of the connection terminals 130 is elongated in shape so as to extend from one end to the other end along the shorter side direction of the rectangular opening 150. Each of the second surface regions 142 is located between adjacent ones of the connection terminals 130. As in the case of the above embodiment, each of the connection terminals 130 has a base portion 132, a covering portion 134 and a filling portion 138 in the present modification example.

It is thus possible according to the present modification example to, even when the mechanical and electrical characteristics of the base portion 132 are deteriorated due to the occurrence of the hollow 130, allow the filling portion 138 to recover the deteriorated mechanical and electrical characteristics of the base portion 132 and thereby improve the reliability of connection of the connection terminal 130 as in the case of the above embodiment.

C. Another Modification Example

Figure 9:
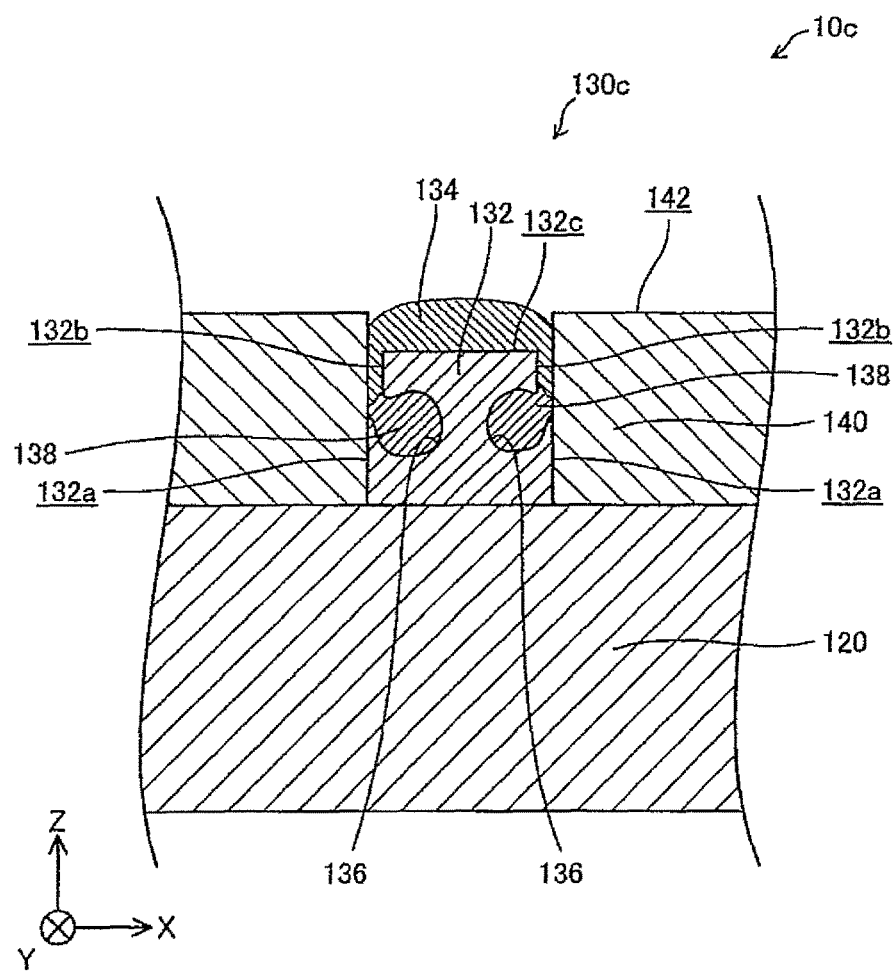
FIG. 9 is an enlarged section view of part of a wiring substrate, schematically showing the detailed configuration of a connection terminal in the wiring substrate, according to another modification example of the embodiment of the present invention.

FIG. 9 is a top view of a wiring substrate 10c according to another modification example of the above embodiment. Herein, the same constituent parts of the wiring substrate 10c as those of the wiring substrate 10 of the above embodiment are denoted by the same reference numerals to avoid duplicating explanation thereof. It is noted that the present modification example is also applicable to the other embodiments and other modification examples explained in the present specification.

The wiring substrate 10c of the present modification example is the same as the wiring substrate 10 of the above embodiment, except for connection terminals 130c. The connection terminal 130c of the present modification example is the same as the connection terminal 130 of the above embodiment, except that the respective portions of the connection terminals 130c are different in configuration because of the reason that the end region 132c of the base portion 132 of the connection terminal 130c is situated on the −Z axis side with respect to the second surface region 142 of the surface layer 140.

The base portion 132 of the connection terminal 130c is located adjacent to the surface layer 140. In the present modification example, the lateral region 132a of the base portion 132 is situated on the −Z axis side with respect to the second surface region 142 of the surface layer 140 and adjacent to the inside of the surface layer 140. The lateral region 132b and the end region 132c of the base portion 132 are situated on the −Z axis side with respect to the second surface region 142 of the surface layer 140 and are covered by the covering portion 134. In the present modification example, the covering portion 134 reaches a point on the +Z axis side of the second surface region 142 of the surface layer 140. The filling portion 138 is also situated on the −Z axis side with respect to the second surface region 142 of the surface layer 140.

Further, the production method of the wiring substrate 10c is the same as that of the above embodiment, except that the base portion 132 and the surface layer 140 are formed such that the end region 132c of the base portion 132 is situated on the −Z axis side with respect the second surface region 142 of the surface layer 140.

It is thus possible according to the above-mentioned present modification example to, even when the mechanical and electrical characteristics of the base portion 132 are deteriorated due to the occurrence of the hollow 130, allow the filling portion 138 to recover the deteriorated mechanical and electrical characteristics of the base portion 132 and thereby improve the reliability of connection of the connection terminal 130 as in the case of the above embodiment.

D. Other Embodiments

The present invention is not limited to the above aspects, embodiments and modifications/variations and can be embodied in various forms without departing from the scope of the present invention. For example, it is feasible to appropriately replace or combine any of the technical features of the aspects of the present invention described in "Summary of the Invention" and the technical features of the embodiments and modifications/variations of the present invention in order to solve part or all of the above-mentioned problems or achieve part or all of the above-mentioned effects. Any of these technical features, if not explained as essential in the present specification, may be deleted as appropriate.

DESCRIPTION OF REFERENCE NUMERALS 10, 10b, 10c: Wiring substrate
20: Semiconductor chip
30: Underfill material
120: Substrate layer
130, 130c: Connection terminal
132: Base portion
132a: Lateral region
132b: Lateral region
132c: End region
132d: Lateral region
132e: End region
134: Covering portion
136: Hollow
138: Filling portion
140: Surface layer
141: First surface region
142: Second surface region
148: Wall surface region
150: Opening
232: Connection terminal
SD: Soldering

What is claimed is:

1. A production method of a wiring substrate, the wiring substrate comprising:
a surface layer having electrical insulation properties; and
a connection terminal protruding from the surface layer and including a base portion made of an electrically conductive first metal and a covering portion made of an electrically conductive second metal having a melting point lower than that of the first metal and covering the base portion, the production method comprising:
applying the second metal to the base portion by displacement plating such that the covering portion is formed on the base portion and a hollow is formed in the base portion so as to extend from a lateral surface of the base portion toward the inside;
heating the connection terminal at a temperature higher than or equal to the melting point of the second metal so as to fill the hollow with a molten metal melted from at least the covering portion among the base portion and the covering portion and thereby forming a filling portion made of at least one of the second metal and an alloy containing the first and second metals and filling the hollow in the base portion.

2. The production method of the wiring substrate according to claim 1, wherein the first metal is copper (Cu); and wherein the second metal is tin (Sn).

3. The production method of the wiring substrate according to claim 1, wherein the base portion is located so as to so as to extend through the surface layer and protrude from the surface layer.

* * * * *

UNITED STATES PATENT AND TRADEMARK OFFICE
CERTIFICATE OF CORRECTION

PATENT NO. : 10,123,415 B2
APPLICATION NO. : 14/416254
DATED : November 6, 2018
INVENTOR(S) : Takahiro Hayashi et al.

It is certified that error appears in the above-identified patent and that said Letters Patent is hereby corrected as shown below:

In the Claims

Claim 3, Column 10, Lines 47-48, replace "so as to so as to" with "so as to".

Signed and Sealed this
Eleventh Day of December, 2018

Andrei Iancu
*Director of the United States Patent and Trademark Office*